United States Patent
Chan

(10) Patent No.: US 8,059,850 B2
(45) Date of Patent: Nov. 15, 2011

(54) CONDENSER MICROPHONE

(75) Inventor: Chao-Kai Chan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 798 days.

(21) Appl. No.: 12/168,918

(22) Filed: Jul. 8, 2008

(65) Prior Publication Data

US 2009/0154752 A1 Jun. 18, 2009

(30) Foreign Application Priority Data

Dec. 17, 2007 (CN) .......................... 2007 1 0203154

(51) Int. Cl.
*H04R 9/08* (2006.01)
*H04R 25/00* (2006.01)
*H04R 9/06* (2006.01)

(52) U.S. Cl. ........ 381/355; 162/163; 162/184; 162/186; 162/398

(58) Field of Classification Search .................. 381/150, 381/162, 163, 184, 186, 355, 360, 398
See application file for complete search history.

(56) References Cited

U.S. PATENT DOCUMENTS

2009/0257613 A1 * 10/2009 Khamashta et al. .......... 381/355
* cited by examiner

*Primary Examiner* — Long Tran
(74) *Attorney, Agent, or Firm* — Altis Law Group, Inc.

(57) ABSTRACT

An exemplary condenser microphone includes a printed circuit board, a first via, a second via, and a number of through holes. The first and second vias are formed in the printed circuit board for the signal line and ground line respectively passing therethrough. The through holes are formed surrounding the first and second vias. Inner walls of the through holes are coated with a conductive material.

20 Claims, 3 Drawing Sheets

CONDENSER MICROPHONE

BACKGROUND

1. Field of the Invention

The present invention relates to condenser microphones and, more particularly, to a condenser microphone capable of reducing acoustic noise from high-frequency sources.

2. Description of the Related Art

Condenser microphones are used in many portable electronic devices, such as digital video cameras, digital still cameras, and mobile phones. One of the challenges of utilizing condenser microphones in electronic devices is that noise generated by high-frequency components in the electronic devices may affect recording quality.

What is needed, therefore, is a condenser microphone that can overcome the above-described shortcoming.

SUMMARY

An exemplary condenser microphone apparatus includes a printed circuit board, a first via, a second via, and a number of through holes. The first and second vias are formed in the printed circuit board for the signal line and ground line respectively passing therethrough. The through holes are formed surrounding the first and second vias. Inner walls of the through holes are coated with a conductive material.

BRIEF DESCRIPTION OF THE DRAWINGS

Many aspects of the present condenser microphone can be better understood with reference to the accompanying drawings. The components in the drawings are not necessarily drawn to scale, the emphasis instead being placed upon clearly illustrating the principles of the present condenser microphone.

DETAILED DESCRIPTION

Embodiments of the present condenser microphone will now be described in detail below, with reference to the drawings.

Figure 1:
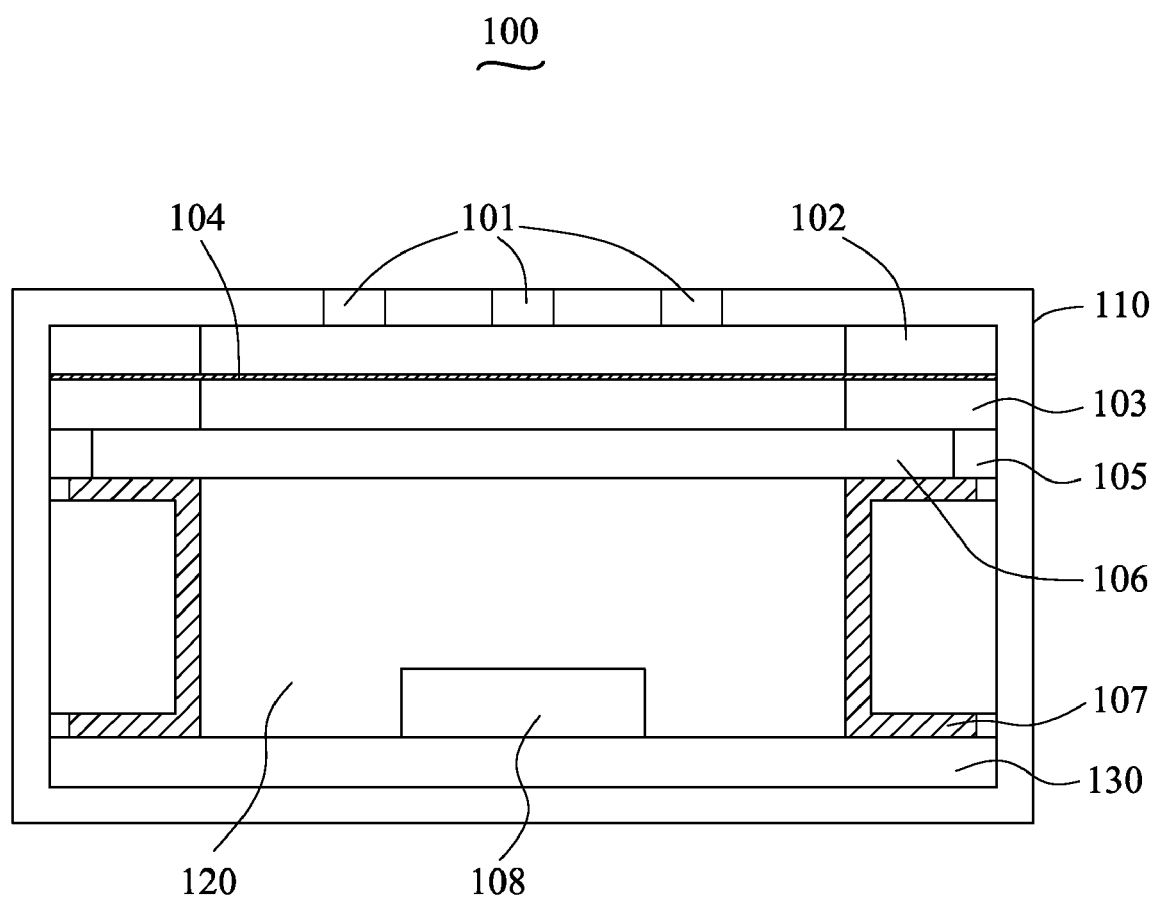
FIG. 1 is a schematic view of a condenser microphone.

Referring to FIG. 1, a condenser microphone 100 is shown. The condenser microphone 100 is formed by successively inserting a polar ring 102, a diaphragm 104, a spacer 103, an insulating ring 105, an electrode plate 106, a conductive pattern 107, and a printed circuit board (PCB) 130 into a cylindrical case 110. The polar ring 102 is disposed on the top end of the cylindrical case 110 and the diaphragm 104 is disposed on one side of the polar ring 102. The electrode plate 106 is disposed on the diaphragm 104 with the spacer 103 positioned therebetween. The top end of the cylindrical case 110 is provided with a number of sound holes 101. The diaphragm 104 is electrically connected to the cylindrical case 110 through the polar ring 102 that is formed of a conductive material. The diaphragm 104 and the polar ring 102 may be integrally formed as a single body.

The electrode plate 106 is formed of a metal plate coated with an organic (polymer) film on which the electrode is formed. The electrode plate 106 is insulated from the cylindrical case 110 by the insulating ring 105. Moreover, the electrode plate 106 is supported by the conductive pattern 107 and is electrically connected to the PCB 130 via the conductive pattern 107. A circuit component 108, such as a junction field effect transistor (JFET), is embedded in the PCB 130. The electrode plate 106, the conductive pattern 107, and the PCB 130 cooperatively define a back chamber 120. In this embodiment, when sound waves strike the condenser microphone 100 through the sound holes 101, the diaphragm 104 vibrates. The sound waves also enter the back chamber 120. When the diaphragm 104 vibrates, the interval between the diaphragm 104 and the electrode plate 106 varies thereby varying electrostatic capacity generated by the diaphragm 104 and the electrode plate 106. As a result, a voltage signal is varied according to the sound waves. The voltage signal is transmitted to the circuit component 108 such as the JFET embedded in the PCB 130 and amplified. The amplified voltage signal is externally transmitted through a connection terminal (not shown).

Figure 2:
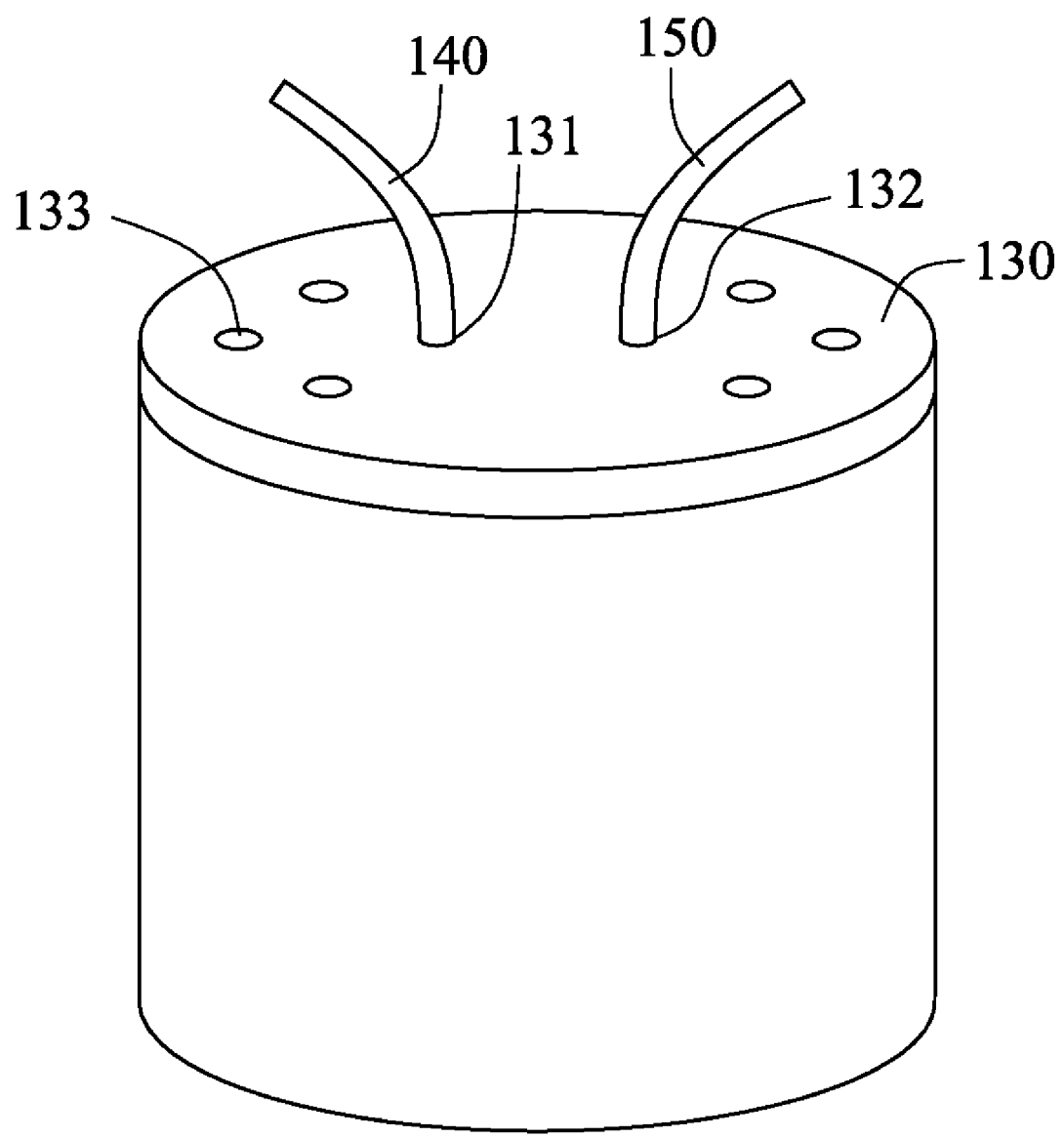
FIG. 2 is an isometric, schematic view of one printed circuit board embedded in the condenser microphone of FIG. 1, according to a first exemplary embodiment.

Referring to FIG. 2, the PCB 130 embedded in the condenser microphone 100 is shown according to a first exemplary embodiment. The PCB 130 defines a first via 131, and a second via 132 therein. A signal line 140 and a ground line 150 corresponding to the first via 131 and the second via 132 are inserted through the PCB 130 respectively and soldered thereto, thereby electrically connecting a digital signal processor (DSP) (not shown) to the PCB 130. The PCB 130 defines a number of through holes 133 arranged around the signal line 140 and the ground line 150 along the edge of the PCB 130. In this embodiment, the signal line 140 and the ground line 150, each has three through holes 133 therearound, and the distances from the first via 131 or the second via 132 to their corresponding through holes 133 are the same. Inner walls of the through holes 133 are formed with a conductive coating such as copper. Induction/capacitance introduced in the through holes 133 corresponding to the signal line 140 can shorten a backflow route of the signal line 140, thereby reducing characteristic impedance of signals transmitted via the signal line 140 and edge rate of the signals. Characteristics of the capacitance can be manipulated by adjusting the number, shape, and dimensions of the coated through holes 133 to reduce noise interference from the high frequency signals transmitted through the signal line 140 that might interfere with the microphone 100. In this embodiment, the number of the through holes 133 is six and cross-sectional shape of each through hole 133 is circular shape. In other embodiments, more or less through holes can be used and cross-sectional shapes other than circular, such as hexagonal may be used.

Figure 3:
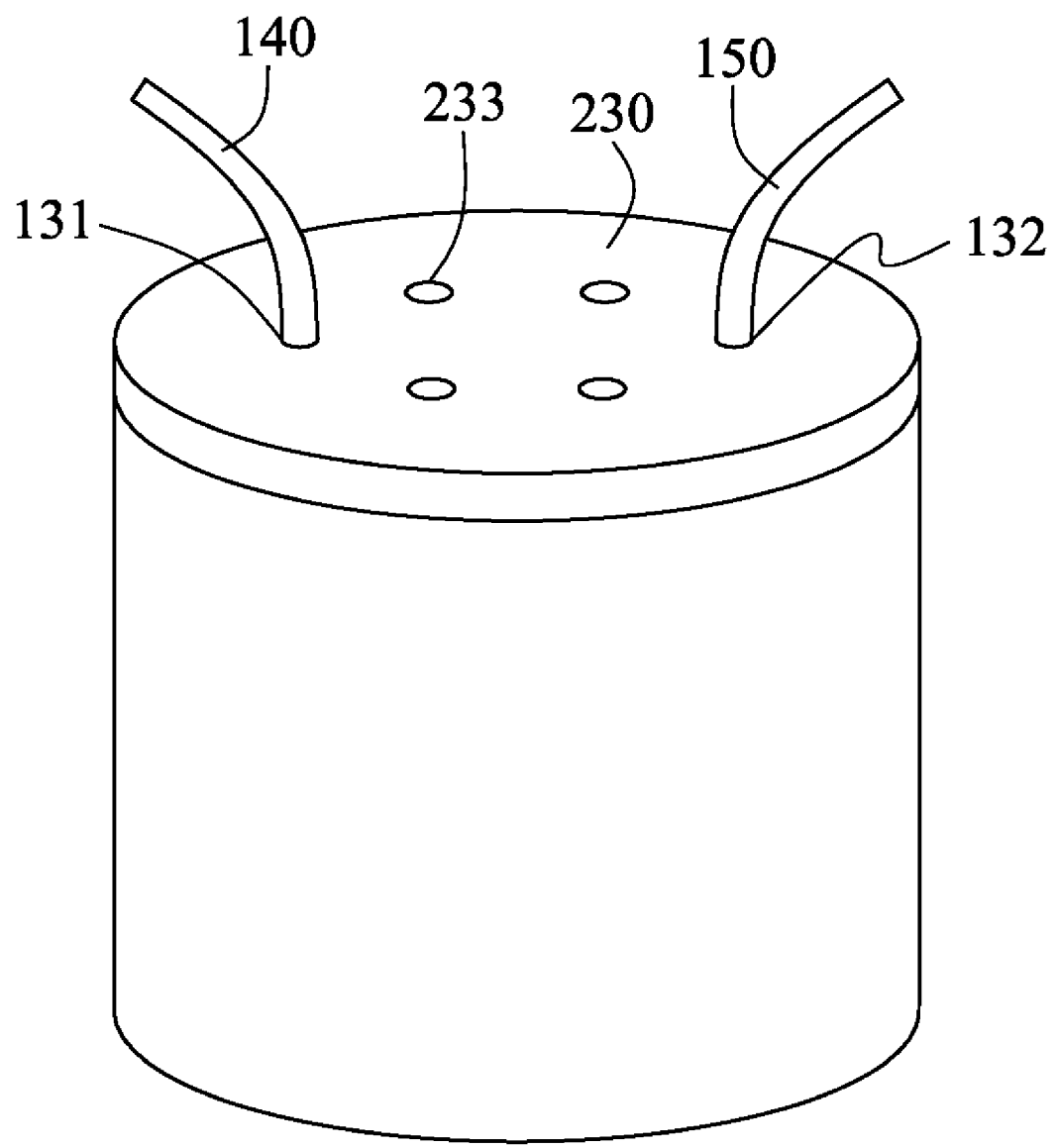
FIG. 3 is an isometric, schematic view of another print circuit board embedded in the condenser microphone of FIG. 1, according to a second exemplary embodiment.

Referring to FIG. 3, another PCB 230 embedded in the condenser microphone 100 is shown according to a second exemplary embodiment. The second exemplary embodiment is identical to the first exemplary embodiment except that the PCB 230 has a number of through holes 233 distributed between the first via 131 and the second via 132 of the PCB 230. The number of the through holes 233 is four and they form a square pattern. Other aspects of the second embodiment are the same as that of the first embodiment, and are not described in detail.

The present condenser microphone 100 has the through holes 133, 233, with the conductive coating formed on the inner wall thereof, positioned adjacent to the signal line 140 and the ground line 150. Thus, noise interference to the microphone 100 from the high frequency signals transmitted through the signal line 140 is reduced.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A condenser microphone, comprising:
    a printed circuit board;
    a first via formed on the printed circuit board for a signal line passing therethrough;
    a second via aside to the first via formed on the printed circuit board for a ground line passing therethrough; and
    a plurality of through holes formed on the printed circuit board and surrounding the first via and the second via of the printed circuit board respectively, the inner wall of each of the through holes being coated with a conductive material.

2. The condenser microphone as claimed in claim 1, wherein the plurality of the through holes is six through holes.

3. The condenser microphone as claimed in claim 1, wherein the through holes have circular shapes.

4. The condenser microphone as claimed in claim 1, wherein each of the through holes is hexagonal shape.

5. The condenser microphone as claimed in claim 1, wherein the through holes are distributed surrounding the first via and the second via along a edge of the printed circuit board.

6. The condenser microphone as claimed in claim 1, wherein the distances from the first via to the corresponding surrounding through holes and the distances from the second via to the corresponding surrounding through holes are the same.

7. The condenser microphone as claimed in claim 1, wherein the through holes are formed between the first via and the second via.

8. The condenser microphone as claimed in claim 7, wherein the plurality of the through holes is four through holes.

9. The condenser microphone as claimed in claim 8, wherein the through holes form a square pattern.

10. A condenser microphone comprising: a case having a number of sound holes formed on an end thereof;
    a diaphragm received in the case and electrically connected to the case and capable of vibrating in accordance with sound pressure introduced through the sound holes;
    an electrode plate received in the case and disposed opposing the diaphragm with a spacer interposed therebetween;
    an insulating ring received in the case and positioned for insulating the electrode plate from the case;
    a printed circuit board embedded in the case on the opposite end from the end defining the sound holes and defining a chamber with the electrode plate, comprising:
    a signal line passing through the printed circuit board;
    a ground line aside the signal line passing through the printed circuit board; and
    a plurality of through holes defined on the printed circuit board and adjacent to the signal line and the ground line and the inner wall of each of the through holes being coated with a conductive material, wherein the plurality of through holes surrounding the signal line and the ground line; and
    a conductive pattern received in the chamber and electrically connected with the electrode plate and the printed circuit board.

11. The condenser microphone as claimed in claim 10, wherein a first via and a second via are formed on the printed circuit board respectively for the signal line and the ground line passing therethrough.

12. The condenser microphone as claimed in claim 10, wherein the plurality of the through holes is six through holes.

13. The condenser microphone as claimed in claim 11, wherein the through holes are distributed around the first via and the second via along edge of the printed circuit board.

14. The condenser microphone as claimed in claim 11, wherein the through holes are formed between the first via and the second via.

15. The condenser microphone as claimed in claim 14, wherein the plurality of the through holes is four through holes.

16. A printed circuit board embedded into a condenser microphone, comprising:
    a first via formed on the printed circuit board for a signal line passing therethrough;
    a second via aside to the first via formed on the printed circuit board for a ground line passing therethrough; and
    a plurality of through holes formed on the printed circuit board and surrounding the first via and the second via of the printed circuit board respectively, the inner wall of each of the through holes being coated with a conductive material.

17. The printed circuit board as claimed in claim 16, wherein the plurality of through holes is circular shapes.

18. The printed circuit board as claimed in claim 16, wherein the plurality of through holes is hexagonal shapes.

19. The printed circuit board as claimed in claim 16, wherein the plurality of through holes is distributed surrounding the first via and the second via along a edge of the printed circuit board.

20. The printed circuit board as claimed in claim 16, wherein the plurality of through holes is formed between the first via and the second via.

* * * * *